(12) United States Patent
Oka et al.

(10) Patent No.: US 11,889,624 B2
(45) Date of Patent: Jan. 30, 2024

(54) FLEXIBLE PRINTED CIRCUIT BOARD AND METHOD OF MANUFACTURING FLEXIBLE PRINTED CIRCUIT BOARD

(71) Applicants: SUMITOMO ELECTRIC PRINTED CIRCUITS, INC., Shiga (JP); SUMITOMO ELECTRIC INDUSTRIES, LTD., Osaka (JP)

(72) Inventors: Yoshio Oka, Osaka (JP); Koji Nitta, Osaka (JP); Shoichiro Sakai, Osaka (JP); Yasushi Mochida, Osaka (JP); Tadahiro Kaibuki, Osaka (JP); Junichi Okaue, Shiga (JP)

(73) Assignees: SUMITOMO ELECTRIC PRINTED CIRCUITS, INC., Shiga (JP); SUMITOMO ELECTRIC INDUSTRIES, LTD., Osaka (JP)

(*) Notice: Subject to any disclaimer, the term of this patent is extended or adjusted under 35 U.S.C. 154(b) by 178 days.

(21) Appl. No.: 17/126,339

(22) Filed: Dec. 18, 2020

(65) Prior Publication Data
US 2021/0219425 A1 Jul. 15, 2021

(30) Foreign Application Priority Data
Jan. 10, 2020 (JP) .................................. 2020-003239

(51) Int. Cl.
*H05K 1/11* (2006.01)
*H05K 3/40* (2006.01)

(52) U.S. Cl.
CPC ............... *H05K 1/118* (2013.01); *H05K 3/40* (2013.01); *H05K 2203/068* (2013.01); *H05K 2203/0723* (2013.01)

(58) Field of Classification Search
CPC .......... H05K 1/118; H05K 2201/0338; H05K 2201/09736; H05K 2201/09745; H05K 1/09–097; H05K 1/11; H05K 1/111; H05K 3/40; H05K 2203/068; H05K 2203/0723; H05K 2201/0367
See application file for complete search history.

(56) References Cited

U.S. PATENT DOCUMENTS

| | | | |
|---|---|---|---|
| 10,548,217 B1 | 1/2020 | Takahashi et al. | |
| 2009/0025963 A1* | 1/2009 | Takayoshi | H05K 1/0269 174/254 |
| 2021/0212208 A1* | 7/2021 | Shibata | H05K 1/0263 |

FOREIGN PATENT DOCUMENTS

| | | |
|---|---|---|
| JP | 2000-012991 | 1/2000 |
| JP | 2004-014672 | 1/2004 |
| JP | 2018-195681 | 12/2018 |

* cited by examiner

*Primary Examiner* — Roshn K Varghese
(74) *Attorney, Agent, or Firm* — IPUSA, PLLC

(57) ABSTRACT

A flexible printed circuit board includes a base film having an insulating property, and one or more interconnects laminated to at least one surface side of the base film. At least one of the one or more interconnects includes, in a longitudinal direction, a first portion and a second portion that is a portion other than the first portion, an average thickness of the second portion being greater than an average thickness of the first portion. A ratio of the average thickness of the second portion to the average thickness of the first portion is greater than or equal to 1.5 and less than or equal to 50.

9 Claims, 5 Drawing Sheets

FLEXIBLE PRINTED CIRCUIT BOARD AND METHOD OF MANUFACTURING FLEXIBLE PRINTED CIRCUIT BOARD

CROSS-REFERENCE TO RELATED APPLICATIONS

This application is based upon and claims priority to Japanese Patent Application No. 2020-003239 filed on Jan. 10, 2020, the entire contents of which are incorporated herein by reference.

BACKGROUND OF THE INVENTION

1. Field of the Invention

The present disclosure relates to a flexible printed circuit board and a method of manufacturing the flexible printed circuit board.

2. Description of the Related Art

Flexible printed circuit boards are widely used to constitute circuitry of various electronic devices. As the size of electronic devices has been reduced in recent years, the size of flexible printed circuit boards is significantly reduced and the density of interconnects of flexible printed circuit boards significantly increases.

As such a small flexible printed circuit board, a flexible printed circuit board including a sheet-like insulating substrate and interconnects laminated to a surface of the substrate by plating has been proposed (see Patent Document 1). In this flexible printed circuit board, the thickness of the plating film, that is, the thickness of the interconnects is made uniform.

Here, in a flexible printed circuit board, current lines and the like for transmitting the current for supplying power may be provided as interconnects. It is desirable that an electrical resistance of the current line is small, because it is desirable for as much current to be able to flow as possible in the current line.

Flexible printed circuit boards are typically used by being bent at a predetermined position. Thus, it is desirable to be flexible, that is, have excellent flexibility.

As described above, space-savings are desired for a flexible printed circuit board for which size reduction is desired.

Therefore, it is desirable to provide a flexible printed circuit board that has excellent flexibility, that can reduce the electrical resistance, and that can achieve space-savings, and it is desirable to provide a method of manufacturing the flexible printed circuit board.

RELATED-ART DOCUMENTS

Patent Documents

Patent Document 1: Japanese Laid-Open Patent Publication No. 2018-195681

SUMMARY OF THE INVENTION

According to one aspect of the embodiments of the present disclosure, a flexible printed circuit board includes a base film having an insulating property, and one or more interconnects laminated to at least one surface side of the base film. At least one of the one or more interconnects includes, in a longitudinal direction, a first portion and a second portion that is a portion other than the first portion, an average thickness of the second portion being greater than an average thickness of the first portion. A ratio of the average thickness of the second portion to the average thickness of the first portion is greater than or equal to 1.5 and less than or equal to 50.

According to another aspect of the embodiments of the present disclosure, with respect to a method of manufacturing a flexible printed circuit board including a base film having an insulating property and one or more interconnects laminated to at least one surface side of the base film, wherein at least one of the one or more interconnects includes, in a longitudinal direction, a first portion and a second portion that is a portion other than the first portion, an average thickness of the second portion being greater than an average thickness of the first portion, and a ratio of the average thickness of the second portion to the average thickness of the first portion is greater than or equal to 1.5 and less than or equal to 50, the method includes forming one or more first plating bodies extending in the longitudinal direction by electroplating a first metallic material on a conductive underlayer of the base film by using a first resist pattern, the conductive underlayer being laminated to at least one surface side of the base film, removing the first resist pattern and non-laminated regions of the conductive underlayer where the one or more first plating bodies are not laminated after the forming one or more first plating bodies, forming one or more second plating bodies by partially electroplating a second metallic material on the one or more first plating bodies in the longitudinal direction by using a second resist pattern after the removing the first resist pattern and non-laminated regions of the conductive underlayer, and removing the second resist pattern after the forming one or more second plating bodies, so that the first portion is formed as a first laminated structure including each portion of the conductive underlayer and each of the one or more first plating bodies, and the second portion is formed as a second laminated structure including each portion of the conductive underlayer, each of the one or more first plating bodies, and each of the one or more second plating bodies.

According to another aspect of the embodiments of the present disclosure, with respect to a method of manufacturing a flexible printed circuit board including a base film having an insulating property and one or more interconnects laminated to at least one surface side of the base film, wherein at least one of the one or more interconnects includes, in a longitudinal direction, a first portion and a second portion that is a portion other than the first portion, an average thickness of the second portion being greater than an average thickness of the first portion, and a ratio of the average thickness of the second portion to the average thickness of the first portion is greater than or equal to 1.5 and less than or equal to 50, the method includes forming one or more third plating bodies extending in the longitudinal direction by electroplating a third metallic material on a conductive underlayer of the base film by using a third resist pattern, the conductive underlayer being laminated to at least one surface side of the base film, removing the third resist pattern after the forming one or more third plating bodies, forming one or more fourth plating bodies extending in the longitudinal direction by electroplating a fourth metallic material so as to include at least a non-laminated region of the conductive underlayer where the one or more third plating bodies are not laminated and connect to one or more third plating bodies in the longitudinal direction by using a fourth resist pattern after the removing the third resist pattern, an average thickness of each of the one or more fourth plating bodies being greater than an average thickness of each of the one or more third plating bodies, and removing the fourth resist pattern and non-laminated regions of the conductive underlayer where the one or more third plating bodies and one or more fourth plating bodies are not laminated after the forming one or more fourth plating bodies, so that the first portion is formed as a third laminated structure including each portion of the conductive underlayer and each of the one or more third plating bodies, and the second portion is formed as a fourth laminated structure including each portion of the conductive underlayer and each of the one or more fourth plating bodies.

DESCRIPTION OF THE EMBODIMENTS

Figure 1:
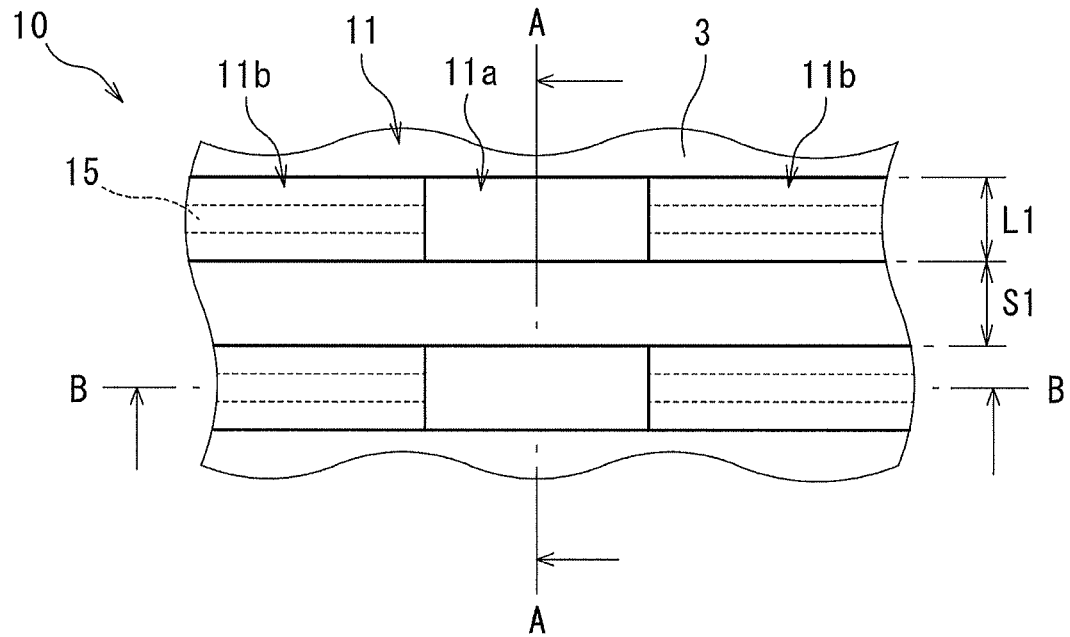
FIG. 1 is a schematic top view illustrating a flexible printed circuit board according to a first embodiment.

Description of Embodiments of the Present Disclosure

A flexible printed circuit board according to one aspect of the present disclosure is a flexible printed circuit board including a base film having an insulating property and one or more interconnects laminated to at least one surface side of the base film. At least one of the one or more interconnects includes one or more first portions and one or more second portions that are other than the one or more first portions, in a longitudinal direction of the flexible printed circuit board. The average thickness of the second portion is greater than the average thickness of the first portion. A ratio of the average thickness of the second portion to the average thickness of the first portion is greater than or equal to 1.5 and less than or equal to 50.

Here, it is considered that the thickness of the interconnect is increased as a measure for reducing the electrical resistance of the interconnect. However, if the thickness of the interconnect is increased, the flexibility of the flexible printed circuit board might be reduced. In addition, if the thickness of the interconnect is increased too great, a mounting portion might become too thick when the flexible printed circuit board is mounted, or a connecting portion might become too thick when another circuit board is connected, so that achieving film thinning (i.e., space-savings) might be difficult. In contrast, as a measure to reduce the electrical resistance of the interconnect and improve the flexibility of the interconnect, it is conceivable to increase the line width of the interconnect. However, if the line width of the interconnect is increased as described above, there is a possibility that space-savings cannot be achieved.

With respect to the above, in the flexible printed circuit board, the ratio of the average thickness of the second portion to the average thickness of the first portion is within the above-described range. As described, the average thickness of the first portion is less than the average thickness of the second portion, so that the flexibility of the flexible printed circuit board can be improved. Additionally, the average thickness of the second portion is greater than the average thickness of the first portion, so that the electrical resistance of the interconnect can be reduced. In addition, the average thickness of the second portion is greater than the average thickness of the first portion, so that greater space-savings of the flexible printed circuit board can be achieved in comparison with a case in which the line width of the interconnect is increased. Therefore, the flexible printed circuit board has improved flexibility, can reduce the electrical resistance, and can achieve space-savings.

The average line width of the interconnect is preferably greater than or equal to 3 μm and less than or equal to 100

μm, and the average interval of the interconnects is preferably greater than or equal to 3 μm and less than or equal to 100 μm.

As described above, the average line width of the interconnect and the average interval of the interconnects are within the above-described range, so that greater space-savings of the flexible printed circuit board can be achieved.

A ratio of a minimum cross-sectional area of the second portion in the thickness direction to a minimum cross-sectional area of the first portion in the thickness direction is preferably greater than or equal to 0.5 and less than or equal to 200.

As described above, the ratio of the minimum cross-sectional area of the second portion to the minimum cross-sectional area of the first portion is within the above-described range, so that space-savings of the flexible printed circuit board can be achieved and the electrical resistance of an entirety of the interconnect (i.e., the sum of the electrical resistances of the first portion and the second portion) can be reduced.

A ratio of the average thickness to the minimum line width in the first portion is preferably greater than or equal to 0.3 and less than or equal to 5, and a ratio of the average thickness to the minimum line width in the second portion is preferably greater than or equal to 0.5 and less than or equal to 10.

As described above, the ratio of the average thickness to the minimum line width in the first portion is within the above-described range, and the ratio of the average thickness to the minimum line width in the second portion is within the above-described range, so that space-savings of the flexible printed circuit board can be achieved.

A method of manufacturing a flexible printed circuit board according to another aspect of the present disclosure is a method of manufacturing a flexible printed circuit board including a base film having an insulating property and one or more interconnects laminated to at least one side surface of the base film. At least one interconnect includes one or more first portions and one or more second portions that are other than the one or more interconnects in the longitudinal direction. The average thickness of the second portion is greater than the average thickness of the first portion. The ratio of the average thickness of the second portion to the average thickness of the first portion is greater than or equal to 1.5 and less than or equal to 50. The method includes a first plating step of forming one or more first plating bodies by electroplating a first metallic material on a conductive underlayer of the base film by using a first resist pattern, the conductive underlayer being laminated to at least one side surface of the base film, a first removing step of removing the first resist pattern and non-laminated regions of the conductive underlayer where the first plating bodies are not laminated after the first plating step, a second plating step of forming one or more second plating bodies by electroplating a second metallic material on one or more portions of each of the one or more first plating bodies in the longitudinal direction by using a second resist pattern after the first removing step, and a second removing step of removing the second resist pattern after the second plating step. The first portion is formed as a first laminated structure including the conductive underlayer and the first plating body. The second portion is formed as a second laminated structure including the conductive underlayer, the first plating body, and the second plating body.

According to the method of manufacturing the flexible printed circuit board, the flexible printed circuit board described above can be manufactured. That is, the flexible printed circuit board that has improved flexibility, that can reduce the electrical resistance, and that can achieve space-savings can be manufactured.

A method of manufacturing a flexible printed circuit board according to another aspect of the present disclosure is a method of manufacturing a flexible printed circuit board including a base film having an insulating property and one or more interconnects laminated to at least one side surface of the base film. At least one interconnect includes one or more first portions and one or more second portions that are portions other than the one or more first portions in the longitudinal direction. The average thickness of the second portion is greater than the average thickness of the first portion. A ratio of the average thickness of the second portion to the average thickness of the first portion is greater than or equal to 1.5 and less than or equal to 50. The method includes a third plating step of forming one or more third plating bodies extending in the longitudinal direction by electroplating a third metallic material on a conductive underlayer of the base film by using a third resist pattern, the conductive underlayer being laminated to at least one side surface of the base film, a third removing step of removing the third resist pattern after the third plating step, a fourth plating step of forming one or more fourth plating bodies that extend in the longitudinal direction by electroplating a fourth metallic material so as to at least include non-laminated regions of the conductive underlayer where the third plating bodies are not laminated and connect the third plating bodies in the longitudinal direction by using a fourth resist pattern after the third removing step, and the average thickness of the fourth plating body being greater than the average thickness of the third plating body, a fourth removing step of removing the fourth resist pattern and the non-laminated regions of the conductive underlayer where the third plating bodies and the fourth plating bodies are not laminated after the fourth plating method. The first portion is formed as a third laminated structure including the conductive underlayer and the third plating body, and the second interconnect is formed as a fourth laminated structure including the conductive underlayer and the fourth plating body.

Here, the "average thickness" indicates an average of the thickness measured at any ten points of each of the first portion and the second portion in a single interconnect. The "thickness" indicates a distance between the base film and a top edge of the interconnect in a direction normal to the base film. The "line width" indicates the dimension in a direction perpendicular to the longitudinal direction in a single interconnect. The "interval" indicates a distance between adjacent surfaces of two interconnects facing each other, and the "average interval" indicates a value obtained by measuring the distances between respective adjacent surfaces at multiple positions in the longitudinal direction of the interconnect, and calculating an average value of the measurement results. The "average line width" indicates a value obtained by measuring the maximum width of the interconnect at multiple positions in the longitudinal direction, in a cross section perpendicular to the longitudinal direction of the interconnect, and calculating an average value of the measurement results. The "minimum cross-sectional area" indicates a minimum value of a cross-sectional area perpendicular to the longitudinal direction of each of the first portion and the second portion in a single interconnect. The "minimum line width" indicates a minimum value of the line width of each of the first portion and the second portion in a single interconnect. However, a land portion including a via (a through-hole, a blind via, and a field via) for connecting between interconnects, a land portion connected to mounting components, a land portion used for connecting to another printed circuit board or a connector, and the like will be excluded from measuring the "thickness," the "line width," the "interval", and the "cross-sectional area" specified above. The "interconnect" corresponds to a "wiring layer".

Details of Embodiments of the Present Disclosure

In the following, embodiments of the flexible printed circuit board according to the present disclosure and a method of manufacturing the flexible printed circuit board will be described in detail with reference to the drawings.

In the embodiments, a "front surface side" refers to a side in the thickness direction of the base film where the interconnects are laminated, and the front and the back in the embodiment is not meant to determine the front and the back when the flexible printed circuit board is used.

First Embodiment

[Flexible Printed Circuit Board]

Figure 2:
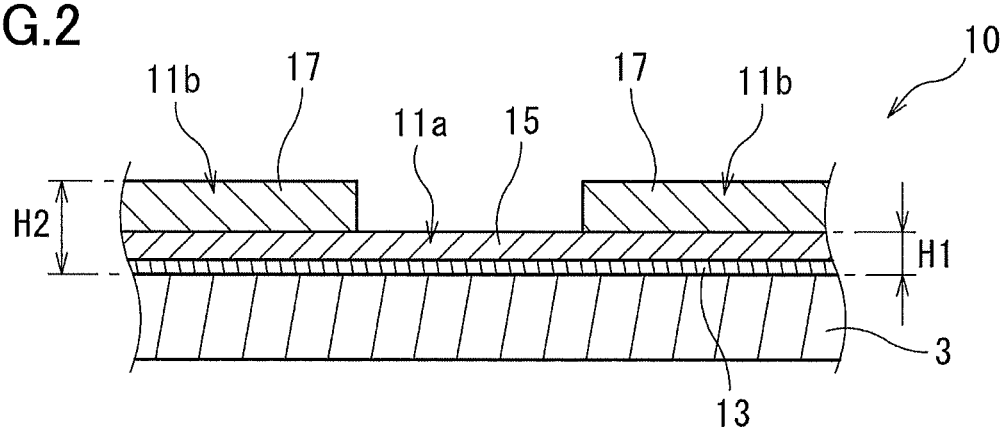
FIG. 2 is a schematic end view illustrating the flexible printed circuit board illustrated in FIG. 1 viewed in the same direction as the arrow direction at the B-B line of FIG. 1.

As illustrated in FIG. 1 and FIG. 2, a flexible printed circuit board 10 according to the present embodiment mainly includes a base film 3 having an insulating property and interconnects 11 laminated to one side (i.e., the front surface side) of the base film 3. The flexible printed circuit board 10 may further include a cover film on the front surface side of the base film 3 or the interconnects 11.

<Base Film>

The base film 3 is a layer made of a synthetic resin having an insulating property. The base film 3 also has a flexible property. The base film 3 is also a substrate for forming the interconnects 11. As a material of forming the base film 3, a low dielectric constant synthetic resin film formed as a sheet may be employed, although the material is not particularly limited as long as the base film is made of a material having an insulating property and a flexible property. Examples of a main component of the synthetic resin film include polyimides, polyethylene terephthalates, liquid crystal polymers, fluoropolymers, and the like. The term "main component" indicates a component contained with the highest percentage and, for example, a component occupying 50 mass % or more of forming materials. The base film 3 may contain another resin other than example resins such as polyimides, and may contain antistatic agents and the like.

The lower limit of the average thickness of the base film 3 is not particularly limited, but is preferably 3 μm, more preferably 5 μm, and even more preferably 10 μm. The upper limit of the average thickness of the base film 3 is not particularly limited, but is preferably 200 μm, more preferably 150 μm, and even more preferably 100 μm. If the average thickness of the base film 3 is below the lower limit, the insulation strength and mechanical strength of the base film 3 might be insufficient. If the average thickness of the base film 3 exceeds the upper limit, the flexible printed circuit board 10 might become unnecessarily thick. Here, the "average thickness" indicates an average of the thickness measured at any 10 points, as described above.

<Interconnect>

The interconnect 11 is laminated directly or through another layer on the front surface side of the base film 3. The interconnect 11 includes multiple first portions 11a in the longitudinal direction (i.e., the left and right direction in FIG. 1 and FIG. 2) and a second portion 11b that is a portion other than the first portion 11a and that has an average thickness H2 greater than an average thickness H1 of the first portion 11a. The ratio of the average thickness H2 of the second portion 11b to the average thickness H1 of the first portion 11a is greater than or equal to 1.5 and less than or equal to 50.

The interconnect 11 includes a first conductive underlayer 13 laminated to the front surface side of the base film 3 and a first plating layer 15 laminated to the first conductive underlayer 13 on a side opposite to the base film 3 (i.e., the front surface side) and multiple second plating layers 17 partially laminated to the first plating layer 15 on a side opposite to the first conductive underlayer 13 (i.e., the front surface side) in the longitudinal direction. A first laminated structure including the first conductive underlayer 13 and the first plating layer 15 constitutes the first portion 11a. A second laminated structure including the first conductive underlayer 13, the first plating layer 15, and the second plating layer 17 constitutes the second portion 11b. Examples of the interconnect 11 include a signal line for transmitting a signal, a current line for supplying a current for power supply, and a current line for supplying a current for generating a magnetic field. FIG. 2 illustrates that the interconnect 11 is disposed only on one side of the base film 3, but it is more preferable that the interconnect 11 is disposed on each side of the base film 3 to achieve greater space-savings.

Examples of the material forming the first conductive underlayer 13 include copper (Cu), silver (Ag), gold (Au), nickel (Ni), titanium (Ti), chromium (Cr), alloys of these materials, and the like. For these forming materials, in order to suppress thermal degradation of an adhesive force of the interconnect 11 to the base film 3, it is preferable that the first conductive underlayer 13 includes a layer (i.e., a first layer) that contains at least one selected from a group consisting of nickel, chromium, titanium, and silver on a side being in contact with the base film 3 (e.g., polyimides). Further, it is more preferable that the first conductive underlayer 13 includes a layer (i.e., the first layer) that contains at least one selected from nickel and chromium that are easily removable and that easily maintain an insulating property. Additionally, it is more preferable that the first conductive underlayer 13 includes a layer (i.e., a second layer) having copper as a main material on an upper side of the first inner layer (i.e., a side opposite to the base film 3). The layer having copper as a main material is disposed, so that the work time required when the interconnect 11 is formed by electroplating can be shortened.

For example, the lower limit of the average thickness of the first layer is preferably 1 nm and more preferably 2 nm. The upper limit of the average thickness of the first layer is preferably 15 nm and more preferably 8 nm. If the average thickness is below the lower limit, thermal degradation of the adhesive force of the interconnect 11 to the base film 3 might not be easily suppressed. If the average thickness exceeds the upper limit, the first layer might not be easily removable and the insulating property between the interconnects 11 may not be sufficiently maintained. The first layer may be formed by a sputtering method, an electroplating method, an electroless plating method, or the like.

For example, the lower limit of the average thickness of the second layer is preferably 0.1 μm and more preferably 0.2 μm. The upper limit of the average thickness of the second layer is preferably 2 μm and more preferably 1 μm. If the average thickness is below the lower limit, the work time required for forming the interconnects 11 by electroplating might be excessively long. If the average thickness exceeds the upper limit, the second layer might not be easily removable and the insulating property between the interconnects 11 might not be sufficiently maintained. The second layer is preferably formed by a sputtering method, an electroplating method, an electroless plating method, or the like, and may be formed by combining these methods. In particular, it is preferable that an electroless copper plating layer is disposed on a top surface side of the first conductive underlayer 13, so that when the inner layer is formed by a sputtering method, any defect or the like that may be caused by the sputtering method can be covered.

As illustrated in FIG. 1, in the present embodiment, the first conductive underlayer 13 is formed such that the line width of a region where the second plating layer 17 is laminated is less than the line width of another region.

Examples of the first metallic material for forming the first plating layer 15 include copper, aluminum, silver, gold, nickel, an alloy of these materials, and the like. Among these materials, copper or a copper alloy are preferable from the viewpoint of improving conductivity and reducing cost. For example, the first plating layer 15 is formed in the same shape as the first conductive underlayer 13 viewed in a direction perpendicular to the base film 3.

Examples of a second metallic material for forming the second plating layer 17 include a material similar to the first metallic material. It is preferable that the second metallic material is of the same kind as the first metallic material. The line width of the second plating layer 17 may be the same as or different from the line width of non-laminated region of the first plating layer 15 where the second plating layer 17 is not laminated, viewed in a direction perpendicular to the base film 3. However, the line width of the second plating layer 17 is preferably greater than the line width of the non-laminated region because the electrical resistance of an entirety of the interconnect 11 can be reduced.

When multiple interconnects 11 are disposed adjacent to each other, the lower limit of the average line width L1 of the interconnect 11 is preferably 3 μm, more preferably 5 μm, and even more preferably 10 μm. The upper limit of the average line width L1 of the interconnect 11 is preferably 100 μm, more preferably 75 μm, and even more preferably 50 μm. If the average line width L1 of the interconnect 11 is below the lower limit, the mechanical strength of the interconnect 11 might be insufficient. If the average line width L1 of the interconnect 11 exceeds the upper limit, there is a possibility that sufficient space-savings cannot be achieved. The "average line width" is a value obtained by exposing a cross-section of the flexible printed circuit board 10 by using a cross-sectional processing device such as a microtome, measuring the width at multiple positions in the interconnect 11 by using a measuring microscope or the like that can measure the length of a widest portion in the width, and calculating an average value of measured values. In the following, the "average line width" of other members and the like is also measured in substantially the same manner.

When multiple interconnects 11 are disposed adjacent to each other, the lower limit of the average interval S1 of the interconnects 11 is preferably 3 μm, more preferably 5 μm, and even more preferably 10 μm. The upper limit of the average interval S1 of the interconnects 11 is preferably 100 μm, more preferably 75 μm, and even more preferably 50 μm. If the average interval S1 of the interconnects 11 is below the lower limit, a short circuit might occur. If the average interval S1 of the interconnects 11 exceeds the upper limit, there is a possibility that sufficient space-savings cannot be achieved. The "average interval" is a value obtained by exposing a cross-section of the flexible printed circuit board 10 by using a cross-sectional processing device such as a microtome, measuring the distances between respective interconnects 11 at multiple positions by using a microscope or the like that can measure the smallest distance, and calculating an average value of measured results. In the following, the "average interval" of other members and the like is measured in substantially the same manner.

The first plating layer 15 and the second plating layer 17 are much thicker than the first conductive underlayer 13. Thus, the thickness of the first portion 11a can be determined mainly by the thickness of the first plating layer 15. The thickness of the second portion 11b can be determined mainly by the thickness of the first plating layer 15 and the second plating layer 17.

(First Portion)

The average thickness H1 of the first portion 11a can be suitably set so that the ratio of the average thickness H2 of the second portion 11b to the average thickness H1 of the first portion 11a is greater than or equal to 1.5 and less than or equal to 50. For example, the lower limit of the average thickness H1 of the first portion 11a is preferably 3 μm, more preferably 5 μm, and even more preferably 10 μm. The upper limit of the average thickness H1 of the first portion 11a is preferably 30 μm, more preferably 25 μm, and even more preferably 20 μm. If the average thickness H1 is below the lower limit, the mechanical strength of the first portion 11a might be insufficient. If the average thickness H1 exceeds the upper limit, the flexibility of the first portion 11a might be reduced. The "average thickness" is a value obtained for each given first portion 11a by exposing a cross-section of the flexible printed circuit board 10 by using a cross-section processing device such as a microtome, measuring the thickness obtained by cross-section observations at any ten points in the given first portion 11a, and calculating an average value of the measurement results. In the following, the "average thickness" of other members and the like is a value measured in substantially the same manner.

The lower limit of the ratio of the average thickness H1 to the minimum line width (which is not illustrated) of the first portion 11a (i.e., an aspect ratio), is preferably 0.3, more preferably 0.5, and even more preferably 0.7. The upper limit of the ratio is preferably 5, more preferably 2, and even more preferably 1.0. If the ratio is below the lower limit, there is a possibility that sufficient space-savings cannot be achieved. If the ratio exceeds the upper limit, there is a possibility that sufficient space-savings cannot be achieved. The "minimum line width" is a value obtained for each given first portion 11a by exposing the cross-section of the flexible printed circuit board 10 by using a cross-section processing device such as a microtome, and measuring the width by using a microscope or the like that can measure the length of a narrowest portion of the given first portion 11a of the interconnect 11. However, the "minimum line width" is the width of the narrowest portion in a region excluding any defective region of the first portion 11a. Here, the defective region to be removed from regions to be measured is a region that is recessed inward (or missing) from at least one edge in the width direction when the microscope observation is performed as described above. Specifically, the defective region is a region in which the width of a missing portion at maximum is ¼ or more of the average line width of the other regions (i.e., regions other than the defective region) in the longitudinal direction of the first portion 11a. The average line width is measured in a manner similar to the method of measuring the "average line width" described above. In the following, the "minimum line width" of other members and the like is also measured in substantially the same manner.

The minimum line width of the first portion 11a may be suitably set to satisfy, for example, the aspect ratio described above. For example, the lower limit of the minimum line width of the first portion 11a is preferably 3 µm, more preferably 5 µm, and even more preferably 10 µm. The upper limit of the minimum line width of the first portion 11a is preferably 30 µm, more preferably 25 µm, and even more preferably 20 µm. If the minimum line width is below the lower limit, the mechanical strength of the first portion 11a might be insufficient. If the minimum line width exceeds the upper limit, there is a possibility that sufficient space-savings cannot be achieved.

The minimum cross-sectional area in the thickness direction of the first portion 11a may be suitably set so that the ratio of the minimum cross-sectional area in the thickness direction of the second portion 11b to the minimum cross-sectional area in the thickness direction of the first portion 11a (i.e., the minimum cross-sectional area of the second portion 11b/the minimum cross-sectional area of the first portion 11a) is within a predetermined range. The lower limit of the ratio, for example, is preferably 0.5, and more preferably 0.7. The upper limit of the ratio is preferably 200, and more preferably 20. If the ratio is below the lower limit, the electrical resistance of the interconnect 11 might become excessively large. If the ratio exceeds the upper limit, the line width of the second portion 11b might be relatively too great to achieve sufficient space-savings. The "minimum cross-sectional area" is calculated by multiplying the average thickness H1 by the minimum line width. In the following, the "minimum cross-sectional area" of other members and the like is measured in substantially the same manner.

(Second Portion)

The average thickness H2 of the second portion 11b can be suitably set so that the ratio of the average thickness H2 of the second portion 11b to the average thickness H1 of the first portion 11a described above is greater than or equal to 1.5 and less than or equal to 50. For example, the lower limit of the average thickness H2 of the second portion 11b is preferably 5 µm, more preferably 10 µm, and even more preferably 20 µm. The upper limit of the average thickness H2 of the second portion 11b is preferably 100 µm, more preferably 75 µm, and even more preferably 50 µm. If the average thickness H2 is below the lower limit, the electrical resistance of the interconnect 11 might become excessively large. If the average thickness H2 exceeds the upper limit, it might be necessary to increase the line width in order to form the second portion 11b, and there is a possibility that sufficient space-savings cannot be achieved.

The lower limit of the ratio of the average thickness H2 to the minimum line width (which is not illustrated) of the second portion 11b (i.e., the aspect ratio), is preferably 0.5, more preferably 1, and even more preferably 2. The upper limit of the ratio is preferably 10, more preferably 7, and even more preferably 5. If the ratio is below the lower limit, there is a possibility that sufficient space-savings cannot be achieved. If the ratio exceeds the upper limit, there is also a possibility that the interconnect 11 will easily deform or become broken during formation of the interconnect 11 or at a step after the formation of the interconnect 11 in manufacturing the flexible printed circuit board 10.

The minimum line width of the second portion 11b may be suitably set to satisfy, for example, the aspect ratio described above. For example, the lower limit of the minimum line width of the second portion 11b is preferably 5 µm, more preferably 10 µm, and even more preferably 15 µm. The upper limit of the minimum line width of the second portion 11b is preferably 100 µm, more preferably 75 µm, and even more preferably 50 µm. If the minimum line width is below the lower limit, the mechanical strength of the second portion 11b might be insufficient. If the minimum line width exceeds the upper limit, there is a possibility that sufficient space-savings cannot be achieved.

The minimum cross-sectional area of the second portion 11b in the thickness direction may be suitably set so that the ratio of the minimum cross-sectional area of the second portion 11b to the minimum cross-sectional area of the first portion 11a in the thickness direction is within the predetermined range as described above.

(Ratio of the Average Thickness of the Second Portion to the Average Thickness of the First Portion)

The lower limit of the ratio of the average thickness H2 of the second portion 11b to the average thickness H1 of the first portion 11a is 1.5 as described above, preferably 2, and more preferably 3. The upper limit of the ratio is 50 as described above, and preferably 20, and more preferably 5. If the ratio is below the lower limit, there is a possibility that the electrical resistance of the entirety of the interconnect cannot be reduced. Additionally, there is a possibility that the flexibility cannot be improved. Further, there is a possibility that sufficient space-savings cannot be achieved. If the ratio exceeds the upper limit, there is also a possibility that sufficient space-savings cannot be achieved.

A longitudinal cross-sectional shape (i.e., a cross-sectional shape in the longitudinal direction) of a region in the second portion 11b located above the first portion 11a, that is, a longitudinal cross-sectional shape of ends (i.e., boundaries) of the second plating layer 17 that are adjacent to the first portions 11a is not particularly limited, and can be suitably set. For example, as illustrated in FIG. 2, the shape of the end may be rectangular.

Figure 3:
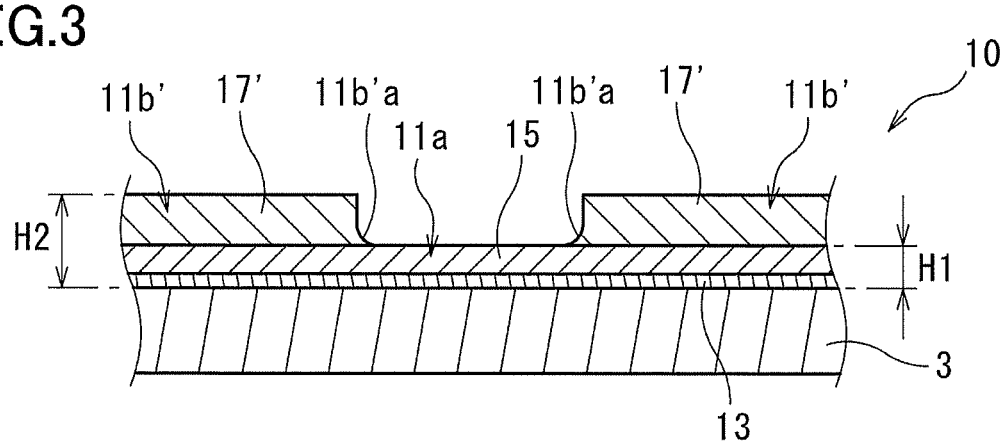
FIG. 3 is a schematic end view illustrating a modified example of a second portion viewed in the same direction as the arrow direction at the B-B line of FIG. 1.

Alternatively, as in the second portion 11b' illustrated in FIG. 3, the longitudinal cross-sectional shape of lower end edges 11b'a at boundaries of the second portion 11b' may be a curved shape. This shape can be formed by treating the second portion 11b' with a chemical that can etch the second portion 11b'. Since the longitudinal cross-sectional shape of the lower end edges 11b'a is a curved shape, breakage due to stress caused by temperature change and breakage due to external force generated when the insulating layer is formed on the flexible printed circuit board 10 can be prevented. Such a curved shape may include, for example, an arc shape having a radius of curvature R. If the longitudinal cross-sectional shape of the lower end edges 11b'a is an arc shape, the lower limit of the radius of the curvature R is preferably 0.2 µm, more preferably 0.5 µm, and even more preferably 1.0 µm. The upper limit of the radius of the curvature R is preferably 4 µm, more preferably 3 µm, and even more preferably 2 µm. If the radius of the curvature R is below the lower limit, it might be difficult to reduce the above-mentioned stress and external force, and it might be difficult to prevent the above-mentioned breakage. If the radius of the curvature R exceeds the upper limit, treatment to form the arc shape might cause the interconnect 11 to be etched entirely, and as a result, an electrical resistance of the entirety of the interconnect 11 might increase.

Figure 4:
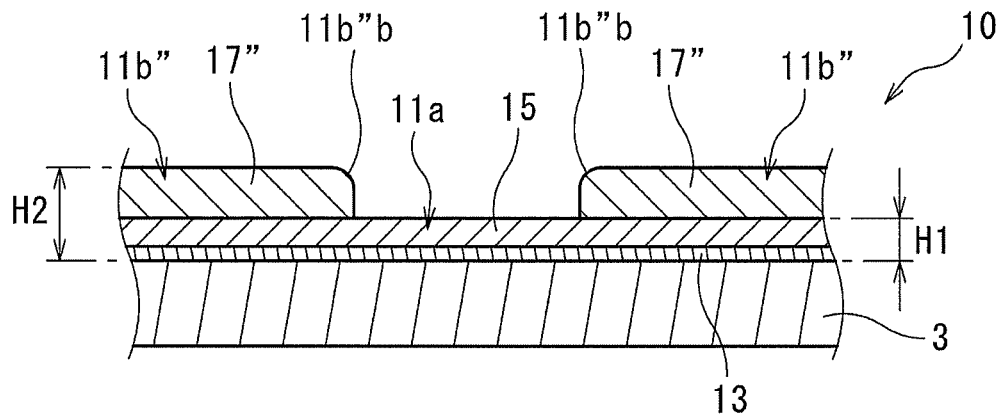
FIG. 4 is a schematic end view illustrating a modified example of the second portion viewed in the same direction as the arrow direction at the B-B line of FIG. 1.

In addition to the above, as illustrated by the second portion 11b" in FIG. 4, a longitudinal cross-sectional shape of upper end edges 11b"b at the boundaries of the second portion 11b may be a curved shape. This shape can be formed by treating the second portion 11b" with a chemical that can etch the second portion 11b"'. Since the longitudinal cross-sectional shape of the upper edge 11b"b is a curved shape, breakage due to stress caused by temperature change and breakage due to external force generated when the insulating layer is formed on the flexible printed circuit board 10 can be prevented. Such a curved shape may include, for example, an arc shape having a radius of curvature r. If the longitudinal cross-sectional shape of the upper edge 11b″b is an arc shape, the lower limit of the radius of the curvature r is preferably 0.2 μm, more preferably 0.5 μm, even more preferably 1.0 μm. The upper limit of the radius of the curvature r is preferably 4 μm, more preferably 3 μm, and even more preferably 2 μm. If the radius of the curvature r is below the lower limit, it might be difficult to reduce the above-mentioned stress and external force, and it might be difficult to prevent the above-mentioned breakage. If the radius of the curvature r exceeds the upper limit, treatment to form the arc shape might cause the interconnect 11 to be etched entirely, and as a result, an electrical resistance of the entirety of the interconnect 11 might increase.

Advantage

In the flexible printed circuit board 10, the ratio of the average thickness H2 of the second portion 11b of the interconnect 11 to the average thickness H1 of the first portion 11a of the interconnect 11 is greater than or equal to 1.5 and less than or equal to 50. The average thickness H1 of the first portion 11a is less than the average thickness H2 of the second portion 11b, so that the flexibility of the flexible printed circuit board 10 can be improved. Additionally, the average thickness H2 of the second portion 11b is greater than the average thickness H1 of the first portion 11a, the electrical resistance of the interconnect 11 can be reduced. Further, the average thickness H2 of the second portion 11b is greater than the average thickness H1 of the first portion 11a, so that more space-savings of the flexible printed circuit board 10 can be achieved in comparison with a case in which the line width of the interconnect 11 is increased. Thus, the flexible printed circuit board 10 has improved flexibility, can reduce the electrical resistance, and can achieve space-savings.

[Method of Manufacturing the Flexible Printed Circuit Board]

Figure 5:
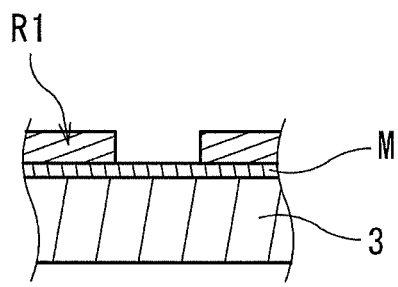
FIG. 5 is a schematic end view for describing a method of manufacturing the flexible printed circuit board illustrated in FIG. 1 and FIG. 2, viewed in the same direction as the arrow direction at the A-A line of FIG. 1.
Figure 6:
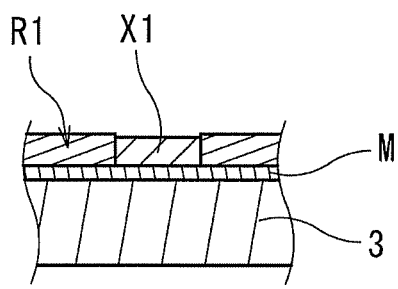
FIG. 6 is a schematic end view for describing the method of manufacturing the flexible printed circuit board illustrated in FIG. 1 and FIG. 2, viewed in the same direction as the arrow direction at the A-A line of FIG. 1.
Figure 7:
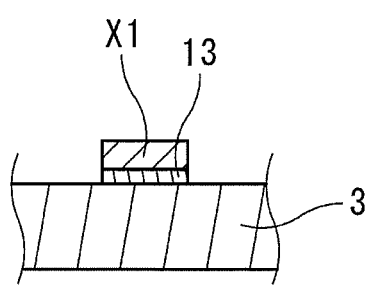
FIG. 7 is a schematic end view for describing the method of manufacturing the flexible printed circuit board illustrated in FIG. 1 and FIG. 2, viewed in the same direction as the arrow direction at the A-A line of FIG. 1.
Figure 8:
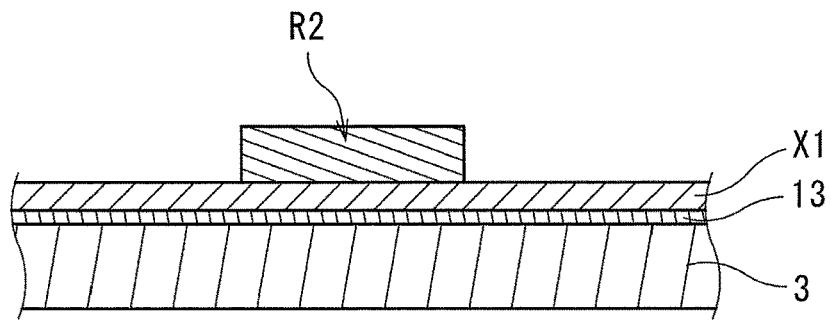
FIG. 8 is a schematic end view for describing the method of manufacturing the flexible printed circuit board illustrated in FIG. 1 and FIG. 2, viewed in the same direction as the arrow direction at the B-B line of FIG. 1.
Figure 9:
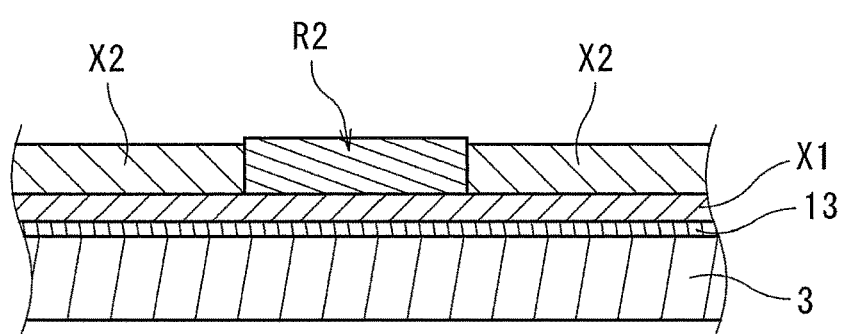
FIG. 9 is a schematic end view for describing the method of manufacturing the flexible printed circuit board illustrated in FIG. 1 and FIG. 2, viewed in the same direction as the arrow direction at the B-B line of FIG. 1.

Next, a method of manufacturing the flexible printed circuit board according to the present embodiment will be described below using the flexible printed circuit board 10. FIGS. 5 to 7 are schematic end views for describing the manufacturing method, viewed in the same direction as the arrow direction at the A-A line of FIG. 1. FIGS. 8 and 9 are schematic end views for describing the manufacturing method, viewed in the same direction as the arrow direction at the B-B line of FIG. 1. The direction normal to the paper surface of FIGS. 5 to 7 and the left and right direction of FIGS. 8 and 9 are in the longitudinal direction.

The method of manufacturing the flexible printed circuit board 10 includes a first plating step of forming multiple first plating bodies X1 by electroplating the first metallic material on a conductive underlayer M of the base film 3 by using a first resist pattern R1, the conductive underlayer M being laminated to one surface side (i.e., a front surface side) of the base film 3, a first removing step of removing the first resist pattern R1 and non-laminated regions of the conductive underlayer M where the first plating body X1 is not laminated after the first plating step, a second plating step of forming multiple second plating bodies X2 by electroplating the second metallic material on multiple regions of the first plating body X1 in the longitudinal direction by using a second resist pattern R2 after the first removing step, and a second removing step of removing the second resist pattern R2 after the second plating step. The first portion 11a is formed as a first laminated structure including a portion of the conductive underlayer M (i.e., the first conductive underlayer 13) and the first plating body X1. The second portion 11b is formed as a second laminated structure including a portion of the conductive underlayer M (i.e., the first conductive underlayer 13), the first plating body X1, and the second plating body X2.

<Conductive Underlayer>

The conductive underlayer M is laminated to the front surface side of the base film 3. The conductive underlayer M is previously laminated to the entire surface of the base film 3 on the front surface side. A portion of the conductive underlayer M (i.e., the first conductive underlayer 13) is ultimately provided such that the portion of the conductive underlayer M is sandwiched between the base film 3 and the first plating body X1 of the first portion 11a in the interconnect 11.

Examples of a material of forming the conductive underlayer M include copper (Cu), silver (Ag), gold (Au), nickel (Ni), titanium (Ti), chromium (Cr), alloys of these materials, and the like. For the material of forming the conductive underlayer M, it is preferable that the conductive underlayer M includes a layer (i.e., a first layer) containing at least one selected from a group consisting of nickel, chromium, titanium, and silver on a side being in contact with the base film 3 (e.g., polyimides) in order to suppress thermal degradation of the adhesion force of the interconnect 11 to the base film 3. Further, it is more preferable that the conductive underlayer M includes a layer (i.e., the first layer) containing at least one selected from nickel and chromium that are easily removable and that easily maintain an insulating property. Additionally, it is more preferable that the conductive underlayer M includes a layer mainly composed of copper (i.e., a second layer) on the upper side of the first inner layer (i.e., a side opposite to the base film 3). By providing the layer mainly composed of copper, the work time required for forming the interconnect 11 by electroplating can be shortened.

For example, the lower limit of the average thickness of the first layer is preferably 1 nm and more preferably 2 nm. The upper limit of the average thickness of the first layer is preferably 15 nm and more preferably 8 nm. If the average thickness of the first layer is below the lower limit, it might be difficult to suppress thermal degradation of the adhesion force of the interconnect 11 to the base film 3. If the average thickness of the first layer exceeds the upper limit, the first layer might not be easily removable, and there is a possibility that the insulating property between the interconnects 11 cannot be sufficiently maintained. The first layer may be formed by a sputtering method, an electroplating method, an electroless plating method, or the like.

For example, the lower limit of the average thickness of the second layer is preferably 0.1 μm and more preferably 0.2 μm. The upper limit of the average thickness of the second layer is preferably 2 μm and more preferably 1 μm. If the average thickness of the second layer is below the lower limit, the time required for forming the interconnects 11 by electroplating might be excessively long. If the average thickness of the second layer exceeds the upper limit, the second layer might not be easily removable and there is a possibility that the insulating property between the interconnects 11 cannot be sufficiently maintained. The second layer is preferably formed by a sputtering method, an electroplating method, an electroless plating method, or the like, or may be formed by combining these methods. In particular, it is preferable that an electroless copper plating layer is disposed on a top surface side of the conductive underlayer M, so that any defect or the like that may be caused by a sputtering method when the inner layer is formed by the sputtering method can be covered.

<First Plating Step>

The first plating step includes a first resist pattern forming step of forming the first resist pattern R1 on the front surface of the conductive underlayer M and a first plating body forming step of forming multiple first plating bodies X1 by electroplating the first metallic material on the conductive underlayer M by using the formed first resist pattern R1.

(First Resist Pattern Forming Step)

In the first resist pattern forming step, the first resist pattern R1 is formed on the front surface of the conductive underlayer M as illustrated in FIG. 5. Specifically, the first resist pattern R1 having a predetermined pattern is formed by laminating a resist film, such as a photosensitive film, on the front surface of the conductive underlayer M and exposing and developing the laminated resist film. Examples of a method of laminating the resist film include a method of applying a resist composition to the front surface of the conductive underlayer M and a method of laminating a dry film photoresist to the front surface of the conductive underlayer M. The exposure and development condition of the resist film may be adjusted depending on the resist composition to be used or the like. An opening of the first resist pattern R1 may be suitably set depending on the first plating bodies X1 to be formed, that is, the conductive underlayer M of the interconnect 11.

(First Plating Bodies Forming Step)

In the first plating bodies forming step, multiple first plating bodies X1 extending in the longitudinal direction are formed on regions of the conductive underlayer M where the resist pattern R1 is not laminated as illustrated in FIG. 6 by electroplating the first metallic material while energizing the conductive underlayer M.

<First Removing Step>

The first removing step includes a first stripping step of stripping the first resist pattern R1 from the conductive underlayer M and a first etching step of etching non-laminated regions (i.e., unnecessary regions) of the conductive underlayer M where the first plating bodies X1 are not laminated.

(First Stripping Step)

In the first stripping step, the first resist pattern R1 is stripped from the conductive underlayer M. As a stripping solution, a known solution can be used. For example, an alkaline aqueous solution such as sodium hydroxide and potassium hydroxide, an organic acid solution such as alkylbenzene sulfonic acid, compound liquid of an organic amine such as ethanolamine and a polar solvent, or the like can be used.

(First Etching Step)

In the first etching step, the conductive underlayer M is etched using the first plating bodies X1 as a mask. By this etching, a laminated structure in which the first plating bodies X1 are laminated to the base film 3 through the first conductive underlayer 13 as illustrated in FIG. 7 can be obtained. During etching, an etching solution that erodes the metal forming the conductive underlayer M is used. As described, what is called a semi-additive method is preferably used in the manufacturing process.

<Second Plating Step>

The second plating step includes a step of forming the second resist pattern R2 so as to cover the exposed base film 3 and regions on the first plating bodies X1 to which the second plating bodies X2 is not to be laminated after the first removing step, and a second plating body forming step of forming the second plating bodies X2 on each of the first plating bodies X1 by electroplating the second metallic material on multiple regions of each of the first plating bodies X1 in the longitudinal direction by using the formed second resist pattern R2.

(Second Resist Pattern Forming Step)

In the second resist pattern forming step, as illustrated in FIG. 8, the second resist pattern R2 having a predetermined pattern is formed by laminating a resist film, such as a photosensitive film, so as to cover an entirety of the exposed base film 3, the first conductive underlayer 13, and the first plating bodies X1, and exposing and developing regions to which the second plating bodies X2 is to be laminated in the laminated resist film. Examples of a method of laminating the resist film include a method of applying a resist composition so as to cover the entirety, and a method of laminating a dry film photoresist to the entirety. The exposure and development condition of the resist film can be adjusted depending on the resist composition to be used or the like. The second resist pattern R2 masks regions on the first plating body X1 to which the second plating body X2 is not to be laminated (here, regions in which the line width is larger than the line width of other regions). An opening of the second resist pattern R2 can be suitably set depending on the second plating body X2 to be formed, that is, the second plating layer 17 of the second portion 11b. The height of the second resist pattern R2 can be suitably set in accordance with the height of the second portion 11b.

(Second Plating Body Forming Step)

In the second plating body forming step, the second plating bodies X2 are formed on each of the first plating bodies X1 so as to partially cover the first plating body X1 in the longitudinal direction (i.e., the left and right direction in FIG. 9) and partially cover the first conductive underlayer 13, by electroplating the second metallic material while energizing the first plating bodies X1 by using the second resist pattern R2, as illustrated in FIG. 9.

<Second Removing Step>

In the second removing step, the second resist pattern R2 is removed from the base film 3. Specifically, the second resist pattern R2 is stripped from the base film 3. The stripping solution may be similar to the stripping solution used in the first stripping step described above. By this stripping, a laminated structure in which the first conductive underlayer 13, the first plating body X1 disposed throughout the first conductive underlayer 13 (corresponding to the first plating layer 15), and the second plating layer 17 disposed on multiple regions of the first plating body X1 in longitudinal direction are laminated on the base film 3 as illustrated in FIG. 2 and FIG. 9 can be obtained. A first laminated structure formed by the first conductive underlayer 13 and the first plating layer 15 constitutes the first portion 11a, and a second laminated structure formed by the first conductive underlayer 13, the first plating layer 15, and the second plating layer 17 constitutes the second portion 11b.

When the second portion 11b' having the longitudinal cross-sectional shape as illustrated in FIG. 3 above is to be formed, in the manufacturing method, by further adding a step of dissolving a portion including the lower end edge at a boundary adjacent to the first portion 11a in the formed second plating body X2 (i.e., the second plating layer 17 of the second portion 11b) with the etching solution after the second removal step, the ability to enable flow of the etching solution at the lower end edge is reduced relative to the ability to enable flow around the lower end edge, and the etching rate is reduced. This can form the longitudinal cross-sectional shape as illustrated in FIG. 3. The etching solution used in this step is similar to the etching solution used in the above-described first etching step.

When the second portion 11b" having the longitudinal cross-sectional shape as illustrated in FIG. 4 above is to be formed, the manufacturing method may further include an upper end edge dissolving step of partially dissolving the upper end edge at the boundary adjacent to the first portion 11a in the formed second plating body X2 (i.e., the second plating layer 17 of the second portion 11b) after the second removal step. The ability to enable flow of the etching solution at the lower end edge is improved relative to the ability to enable flow around the upper end edge by further adding a step of dissolving a portion including the upper end edge at the boundary with the etching solution, thereby increasing the etching rate. This can form the longitudinal cross-sectional shape as illustrated in FIG. 4. The etching solution used in the upper end edge dissolving step is similar to the etching solution used in the above-described first etching step.

Advantage

According to the method of manufacturing the flexible printed circuit board 10, the flexible printed circuit board 10 described above can be manufactured. That is, the flexible printed circuit board 10 that has improved flexibility, that can reduce the electrical resistance, and that can achieve space-savings can be manufactured.

Second Embodiment

Next, a flexible printed circuit board according to a second embodiment and a method of manufacturing the flexible printed circuit board will be described. Components common to the first embodiment will be referenced by the same reference numerals and the description will be omitted.

[Flexible Printed Circuit Board]

Figure 10:
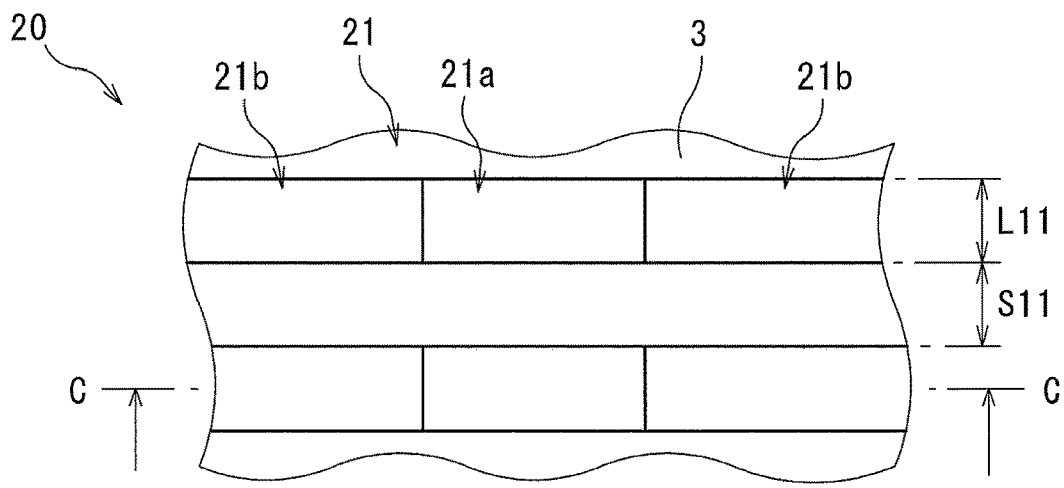
FIG. 10 is a schematic top view illustrating a flexible printed circuit board according to a second embodiment.
Figure 11:
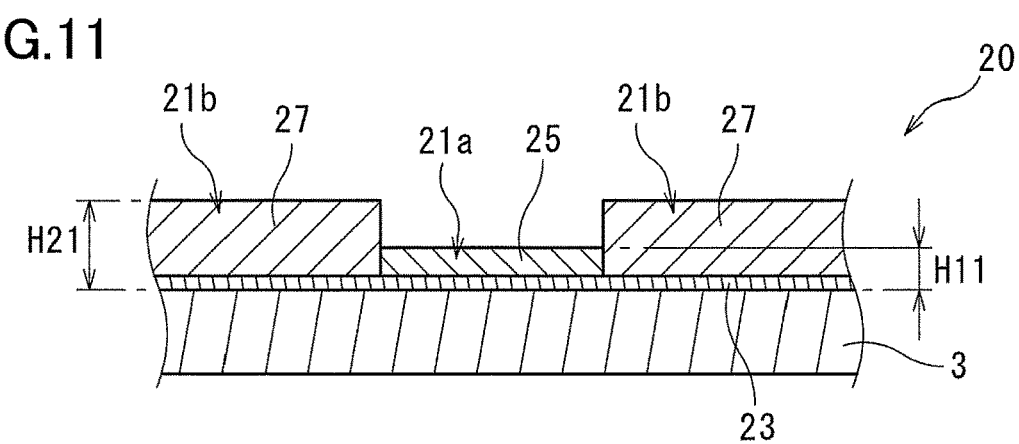
FIG. 11 is a schematic end view illustrating the flexible printed circuit board illustrated in FIG. 10 viewed in the same direction as the arrow direction at the C-C line of FIG. 10.

As illustrated in FIG. 10 and FIG. 11, a flexible printed circuit board 20 according to the second embodiment mainly includes the base film 3 having an insulating property and an interconnect 21 laminated to one side (i.e., the front surface side) of the base film 3. The flexible printed circuit board 20 may further include a cover film on the front surface side of the base film 3 or the interconnects 21.

<Interconnect>

The interconnect 21 is laminated directly or through another layer to the front surface side of the base film 3. The interconnect 21 includes, in the longitudinal direction, a first portion 21a and a second portion 21b that is a portion other than the first portion 21a and that have an average thickness H21 greater than an average thickness H11 of the first portion 21a. A ratio of the average thickness H21 of the second portion 21b to the average thickness H11 of the first portion 21a is greater than or equal to 1.5 and less than or equal to 50.

The interconnect 21 includes a second conductive underlayer 23 laminated to the front surface side of the base film 3, multiple third plating layers 25 laminated to multiple regions of the second conductive underlayer 23, in the longitudinal direction on a side opposite to the base film 3 (i.e., the front surface side) and multiple fourth plating layers 27 connecting to the third plating layers 25 in the longitudinal direction (i.e., the left and right direction in FIG. 10 and FIG. 11) on the side of the second conductive underlayer 23 opposite to the base film 3 (i.e., the front surface side). A third laminated structure including the second conductive underlayer 23 and the third plating layer 25 constitutes the first portion 21a. A fourth laminated structure including the second conductive underlayer 23 and the fourth plating layer 27 constitutes the second portion 21b. Examples of the interconnect 21 include a signal line for transmitting a signal, a current line for supplying the current for power supply, and a current line for supplying the current for generating a magnetic field.

A material of forming the second conductive underlayer 23 may be similar to the material of forming the first conductive underlayer 13 according to the first embodiment described above. The average thickness of the second conductive underlayer 23 can be set as the thickness similar to the average thickness of the first conductive underlayer 13 of the first embodiment described above.

A third metallic material of forming the third plating layer 25 may be similar to the first metallic material according to the first embodiment described above, for example. The line width of the third plating layer 25 can be set to be the same as the line width of the second conductive underlayer 23, for example.

A fourth metallic material of forming the fourth plating layer 27 may be similar to the first metallic material according to the first embodiment described above, for example. The fourth metallic material is preferably of the same kind as the third metal material. For example, the line width of the fourth plating layer 27 can be set to be the same as the line width of the second conductive underlayer 23.

When the multiple interconnects 21 are disposed adjacent to each other, the average line width L11 and the average interval S11 of the interconnects 21 can be set in a manner similar to the average line width L1 and the average interval S1 of the interconnects 11 of the first embodiment described above.

The third plating layer 25 and the fourth plating layer 27 are much thicker than the second conductive underlayer 23. Thus, the thickness of the first portion 21a can be determined mainly by the thickness of the third plating layer 25. The thickness of the second portion 21b can be determined mainly by the thickness of the fourth plating layer 27.

(First Portion)

The average thickness H11 of the first portion 21a, the ratio of the average thickness H11 to the minimum line width (which is not illustrated) of the first portion 21a (i.e., the aspect ratio), the minimum line width of the first portion 21a, the minimum cross-sectional area of the first portion 21a in the thickness direction, and the like can be set in a manner similar to the first portion 11a of the first embodiment described above.

(Second Portion)

The average thickness H21 of the second portion 21b, the ratio of the average thickness H21 to the minimum line width (which is not illustrated) of the second portion 21b (i.e., the aspect ratio), the minimum line width of the second portion 21b, the minimum cross-sectional area of the second portion 21b in the thickness direction, and the like can be set in a manner similar to the second portion 11b of the first embodiment described above.

Although the illustration is omitted, similarly with the second portion 11b' of the first embodiment described above, lower end edges 21b'a at boundaries adjacent to the first portions 21a in the second portion 21b' may have a curved shape as illustrated in FIG. 3. Additionally, although the illustration is omitted, similarly with the second portion 11b" of the first embodiment described above, upper end edges 21b"b at boundaries adjacent to the first portions 21a in the second portion 21b" may be a curved shape as illustrated in FIG. 4 above.

(Ratio of the Average Thickness of the Second Portion to the Average Thickness of the First Portion)

The ratio of the average thickness H21 of the second portion 21b to the average thickness H11 of the first portion 21a can be set in a similar manner to the ratio of the average thickness H2 of the second portion 11b to the average thickness H1 of the first portion 11a of the above described first embodiment. That is, the lower limit of the ratio is 1.5, preferably 2, and more preferably 3, as described above. The upper limit of the ratio is 50, preferably 20, and more preferably 5, as described above. Similarly with the above-described first embodiment, when the interconnect 21 includes the multiple first portions 21a, the average thickness H11 of each of the first portions 21a is set so as to satisfy the ratio with respect to the average thickness H21 of each of the second portions 21b. When the interconnect 21 includes the multiple second portions 21b, the average thickness H21 of each of the second portions 21b is set so as to satisfy the ratio with respect to the average thickness H11 of the first portion 21a (i.e., the average thickness H11 of each of the first portions 21a when multiple first portions 21a are included).

Advantage

In the flexible printed circuit board 20, the ratio of the average thickness H21 of the second portion 21b to the average thickness H11 of the first portion 21a of the interconnect 21 is greater than or equal to 1.5 and less than or equal to 50. Thus, the average thickness H11 of the first portion 21a is less than the average thickness H21 of the second portion 21b, so that the flexibility of the flexible printed circuit board 20 can be improved. Additionally, the average thickness H21 of the second portion 21b is greater than the average thickness H11 of the first portion 21a, so that the electrical resistance of the interconnect 21 can be reduced. In addition, the average thickness H21 of the second portion 21b is greater than the average thickness H11 of the first portion 21a, so that more space-savings of the flexible printed circuit board 20 can be achieved in comparison with a case in which the line width of the interconnect 21 is increased. Therefore, the flexible printed circuit board 20 has improved flexibility, can reduce electrical resistance, and can achieve space-savings.

[Method of Manufacturing the Flexible Printed Circuit Board]

Next, a method of manufacturing the flexible printed circuit board according to the present embodiment will be described using the flexible printed circuit board 20. FIGS. 12 to 16 are schematic end views for illustrating the manufacturing method, viewed in the same direction as the arrow direction at the C-C line of FIG. 10. The left and right direction of FIGS. 12 to 16 is the longitudinal direction.

A method of manufacturing the flexible printed circuit board 20 includes a third plating step of forming multiple third plating bodies X3 extending in the longitudinal direction by electroplating the third metallic material on the conductive underlayer M of the base film 3 by using a third resist pattern R3, the conductive underlayer M being laminated to one side (i.e., the front surface side) of the base film 3, a third removing step of removing the third resist pattern R3 after the third plating step, a fourth plating step of forming multiple fourth plating bodies X4 extending in the longitudinal direction by electroplating the fourth metallic material so as to include at least a non-laminated region of the conductive underlayer M where the third plating bodies X3 are not laminated and longitudinally connect to both end edges of the third plating bodies X3 in the longitudinal direction by using a fourth resist pattern R4 after the third removing step, the average thickness of the fourth plating body X4 being greater than the average thickness of the third plating body X3, and a fourth removing step of removing the fourth resist pattern R4 and non-laminated regions of the conductive underlayer M where the third plating bodies X3 and the fourth plating bodies X4 are not laminated after the fourth plating step. The first portion 21a is formed as a third laminated structure including a portion of the conductive underlayer M (i.e., the second conductive underlayer 23) and the third plating body X3. The second portion 21b is formed as a fourth laminated structure including a portion of the conductive underlayer M (i.e., the second conductive underlayer 23) and the fourth plating body X4.

<Conductive Underlayer>

The conductive underlayer M may be similar to the conductive underlayer M used in the first embodiment described above. Therefore, the detailed description of the conductive underlayer M is omitted.

<Third Plating Step>

The third plating step includes a third resist pattern forming step of forming the third resist pattern R3 on the front surface of the conductive underlayer M and a third plating body forming step of forming the multiple third plating bodies X3 extending in the longitudinal direction by electroplating the third metallic material on the conductive underlayer M by using the formed third resist pattern R3.

(Third Resist Pattern Forming Step)

Figure 12:
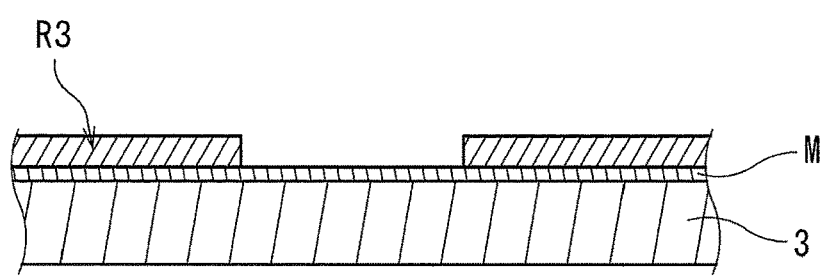
FIG. 12 is a schematic end view for describing a method of manufacturing the flexible printed circuit board illustrated in FIG. 10 and FIG. 11, viewed in the same direction as the arrow direction at the C-C line of FIG. 10.

In the third resist pattern forming step, the third resist pattern R3 is formed on the front surface of the conductive underlayer M as illustrated in FIG. 12. Specifically, the third resist pattern R3 having a predetermined pattern is formed in a manner similar to the first resist pattern forming step according to the first embodiment. The third resist pattern R3 can be suitably set in accordance with the third plating bodies X3 to be formed.

(Third Plating Body Forming Step)

Figure 13:
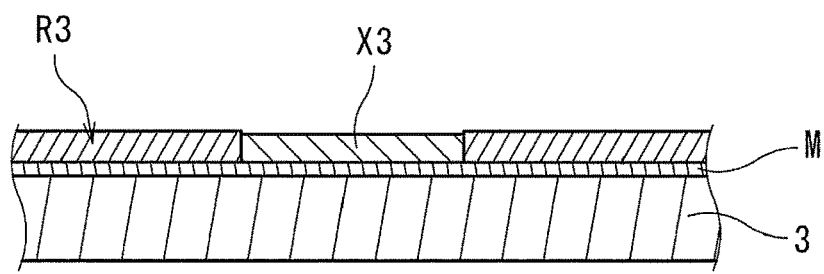
FIG. 13 is a schematic end view for describing a method of manufacturing the flexible printed circuit board illustrated in FIG. 10 and FIG. 11, viewed in the same direction as the arrow direction at the C-C line of FIG. 10.

In the third plating body forming step, the third plating bodies X3 extending in the longitudinal direction (i.e., the left and right direction of FIG. 13) are formed with intervals in the width direction on regions of the conductive underlayer M where the third resist pattern R3 is not laminated as illustrated in FIG. 13 by electroplating the third metallic material while energizing the conductive underlayer M.

<Third Removing Step>

Figure 14:
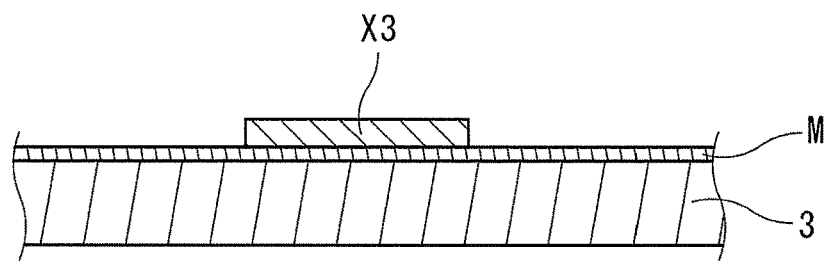
FIG. 14 is a schematic end view for describing a method of manufacturing the flexible printed circuit board illustrated in FIG. 10 and FIG. 11, viewed in the same direction as the arrow direction at the C-C line of FIG. 10.
Figure 15:
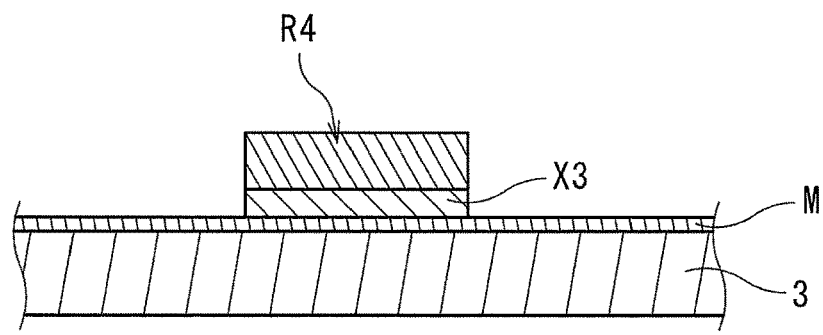
FIG. 15 is a schematic end view for describing a method of manufacturing the flexible printed circuit board illustrated in FIG. 10 and FIG. 11, viewed in the same direction as the arrow direction at the C-C line of FIG. 10.

In the third removing step, the third resist pattern R3 is removed from the conductive underlayer M. Specifically, the third resist pattern R3 is stripped from the conductive underlayer M. The stripping solution is similar to the stripping solution used in the first stripping step of the first embodiment. By this removal, a laminated structure in which the third plating body X3 is laminated to the conductive underlayer M as illustrated in FIG. 14 can be obtained.

<Fourth Plating Step>

The fourth plating step includes a forth resist pattern forming step of forming the fourth resist pattern R4 so as to cover the exposed conductive underlayer M and the third plating bodies X3 after the third removing step described above, and a fourth plating body forming step of forming the fourth plating bodies X5 extending in the longitudinal direction by electroplating the fourth metallic material by using the formed fourth resist pattern R4.

(Fourth Resist Pattern Forming Step)

Figure 16:
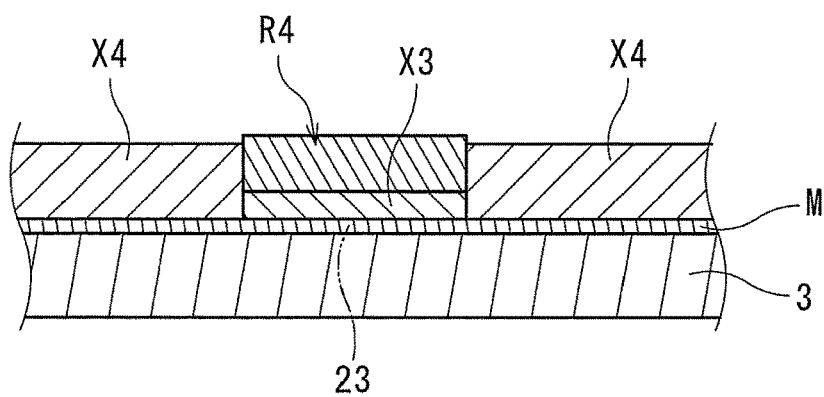
FIG. 16 is a schematic end view for describing a method of manufacturing the flexible printed circuit board illustrated in FIG. 10 and FIG. 11, viewed in the same direction as the arrow direction at the C-C line of FIG. 10.

In the fourth resist pattern forming step, the fourth resist pattern R4 is formed on the third plating bodies X3 as illustrated in FIG. 16. Specifically, the fourth resist pattern R4 having a predetermined pattern is formed by laminating a resist film such as a photosensitive film so as to cover the entirety of the exposed conductive underlayer M and the third plating bodies X3, and exposing and developing regions of the laminated resist film that include at least a non-laminated region where the third plating bodies X3 are not laminated and that connect to third plating bodies X3 in the longitudinal direction (i.e., the left and right direction in FIG. 13). A method of laminating the resist film is similar to the method of forming the first resist pattern according to the first embodiment described above. The fourth resist pattern R4 can be suitably set in accordance with a position of the fourth plating layer 27 of the interconnect 21 to be formed. The height of the fourth resist pattern R4 can be suitably set to be greater than the height of the third resist pattern R3 in accordance with the height of the fourth plating layer 27 of the interconnect 21.

(Fourth Plating Body Forming Step)

In the fourth plating body forming step, the multiple fourth plating bodies X4 that connect both end edges of the respective third plating bodies X3 in the longitudinal direction and that extend in the longitudinal direction are formed so as to longitudinally connect both end edges of the respective third plating bodies X3 in the longitudinal direction (i.e., the left and right direction in FIG. 16) that are disposed on non-laminated regions of the conductive underlayer M where the fourth plating bodies X4 are not laminated as illustrated in FIG. 16 by electroplating the fourth metallic material while energizing the conductive underlayer M.

<Fourth Removing Step>

The fourth removing step includes a second stripping step of stripping the fourth resist pattern R4 from the conductive underlayer M, and a second etching step of etching non-laminated regions (i.e., unnecessary region) of the conductive underlayer M where the third plating bodies X3 and the fourth plating bodies X4 are not laminated.

(Second Stripping Step)

In the second stripping step, the fourth resist pattern R4 is stripped from the conductive underlayer M. The stripping solution is similar to the striping solution used in the first stripping step according to the first embodiment described above.

(Second Etching Step)

In the second etching step, the conductive underlayer M is etched using the third plating bodies X3 and the fourth plating bodies X4 as a mask. By this etching, as illustrated in FIG. 11 and FIG. 16, a third laminated structure (corresponding to the first portion 21a) in which the second conductive underlayer 23 and the third plating body X3 (corresponding to the third plating layer 25) are laminated to the base film 3 is obtained. A fourth laminated structure (corresponding to the second portion 21b) in which the second conductive underlayer 23 and the fourth plating body X4 (corresponding to the fourth plating layer 27) are laminated to the base film 3 is obtained. During etching, an etching solution that erodes the metal forming the second conductive underlayer 23 is used.

For example, in the case of forming the second portion 21b' having the longitudinal cross-sectional shape as illustrated in FIG. 3 above, the manufacturing method may further include a lower end edge dissolving step of dissolving a portion including the lower end edge at the boundary adjacent to the first portion 21a in the formed fourth plating body X4 (that is, the fourth plating layer 27 of the second portion 21b) with the etching solution after the fourth removal step, which reduces the ability to enable flow of the etching solution at the lower end edge relative to the ability to enable flow around the lower end edge, thereby reducing the etching rate. The etching solution used in the lower end edge dissolving step is similar to the etching solution used in the second etching step. In addition, in the case of forming the second portion 21b'' having the longitudinal cross-sectional shape as illustrated in FIG. 4, the lower end edge may be dissolved by controlling the etching amount in the second etching step in the fourth removing step.

Additionally, in the case of forming the second portion 21b'' having the longitudinal cross-sectional shape as illustrated in FIG. 4 above, the manufacturing method may further include an upper end edge dissolving step of partially dissolving the upper end edge at the boundary adjacent to the first portion 21a in the formed fourth plating body X4 (that is, the fourth plating layer 27 of the second portion 21b) with an etching solution after the fourth removing step. The etching solution used in the upper end edge dissolving step is similar to the etching solution used in the second etching step above. In addition, in the case of forming the second portion 21b'' having the longitudinal cross-sectional shape as illustrated in FIG. 4, the upper end edge may be dissolved by controlling the etching amount in the second etching step in the fourth removing step.

Advantage

According to the method of manufacturing the flexible printed circuit board 20, the flexible printed circuit board 20 described above can be manufactured. That is, the flexible printed circuit board 20 that has improved flexibility, that can reduce the electrical resistance, and that can achieve space-savings can be manufactured.

Other Embodiments

The embodiments disclosed herein should be considered to be examples in all respects and non-restrictive. The scope of the present invention is not limited to the configuration of the above-described embodiments. The scope of the present invention is set forth by the appended claims, and it is intended to include all modifications within the scope of the claims and equivalents.

In the above-described embodiments, a flexible printed circuit board including a single base film and multiple interconnects laminated to one side of the base film has been described, but the flexible printed circuit board may be a flexible printed circuit board in which multiple interconnects are laminated to both sides of the single base film. The flexible printed circuit board may also be a multi-layer printed circuit board including multiple base films each having multiple interconnects on either one side or both sides.

In the above-described embodiment, the case in which the flexible printed circuit board includes multiple interconnects has been described, but the flexible printed circuit board may include a single interconnect.

In the above-described embodiment, the case in which the line width of the first portion is the same as the line width of the second portion has been described, but these line widths may be different. For example, the line width of the first portion may be greater than the line width of the second portion. Additionally, for example, the line width of the second portion may be greater than the line width of the first portion. In this case, as the first portion and the second portion, rectangular portions viewed in a direction perpendicular to the base film 3 may be used.

In the above-described embodiment, the case in which the interconnect includes a single first portion and multiple second portions has been described, but the interconnect may include a single first portion and a single second portion, may include multiple first portions and a single second portion, and may include multiple first portions and multiple second portions. For example, the line width of the first portion may be greater than the line width of the second portion.

In the first embodiment, as the shape of the first conductive underlayer 13, the case in which the line width of the region where the second plating layer 17 is formed in the longitudinal direction is less than another region has been described. However, the line width of the region may be the same as or greater than the line width of another region.

In the second plating step of the first embodiment, the case in which the second resist pattern R2 masks only a region of the first plating body X1 in the longitudinal direction has been described, but the second resist pattern may also mask a region between regions to which the second plating body X2 is to be laminated in addition to the region of the first plating body X1 described above.

Figure 17:
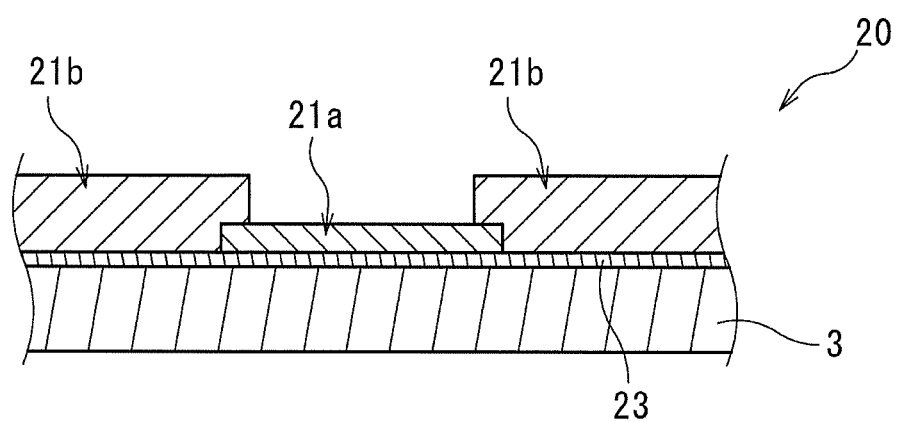
FIG. 17 is a schematic end view illustrating another example of a first portion and the second portion, viewed in the same direction as the arrow direction at the C-C line of FIG. 10.

As another example of the structure illustrated in FIG. 11, the first portion 21a and the second portion 21b may be partially overlapped as illustrated in FIG. 17. The structure can be manufactured by modifying a region of the resist pattern R4 illustrated in FIG. 15. Even if the position of the resist pattern R2 is misaligned in manufacturing, this can enable manufacturing of the interconnect 11 without breaking the interconnect, can improve manufacturing yield, and can reduce distortion at the boundary between the first portion 21a and the second portion 21b. Therefore, the structure described above is more preferable.

INDUSTRIAL APPLICABILITY

The flexible printed circuit board according to the embodiments of the present disclosure, and a flexible printed circuit board manufactured by a method of manufacturing the flexible printed circuit board, has improved flexibility, can reduce the electrical resistance, and can achieve space-savings. Therefore, the flexible printed circuit board can be suitably used, for example, in small electronic devices.

What is claimed is:

1. A flexible printed circuit board comprising:
a base film having an insulating property; and
one or more interconnects laminated to at least one surface side of the base film,
wherein each of at least one of the one or more interconnects includes, in a longitudinal direction, a first portion and a second portion that is a portion other than the first portion, an average thickness of the second portion being greater than an average thickness of the first portion,
wherein a ratio of the average thickness of the second portion to the average thickness of the first portion is greater than or equal to 1.5 and less than or equal to 50,
wherein the first portion includes a first plating layer, and the second portion includes the first plating layer and a second plating layer,
wherein the second plating layer is laminated on the first plating layer at a boundary between the first portion and the second portion,
wherein the second portion includes an edge at the boundary between the first portion and the second portion, and
wherein the edge of the second portion includes an upper end edge and a lower end edge of the second plating layer in the longitudinal direction, and at least one of the upper end edge or the lower end edge has a curved shape.

2. The flexible printed circuit board as claimed in claim 1, wherein an average line width of each of the interconnects is greater than or equal to 3 μm and less than or equal to 100 μm, and an average interval of the interconnects is greater than or equal to 3 μm and less than or equal to 100 μm.

3. The flexible printed circuit board as claimed in claim 1, wherein a ratio of a minimum cross-sectional area of the second portion in a thickness direction to a minimum cross-sectional area of the first portion in the thickness direction is greater than or equal to 0.5 and less than or equal to 200, the minimum cross-sectional area of the first portion in the thickness direction being calculated by multiplying the average thickness of the first portion by a minimum line width of the first portion, and the minimum cross-sectional area of the second portion in the thickness direction being calculated by multiplying the average thickness of the second portion by a minimum line width of the second portion.

4. The flexible printed circuit board as claimed in claim 1, wherein a ratio of the average thickness of the first portion to a minimum line width of the first portion is greater than or equal to 0.3 and less than or equal to 5, and
wherein a ratio of the average thickness of the second portion to a minimum line width of the second portion is greater than or equal to 0.5 and less than or equal to 10.

5. The flexible printed circuit board as claimed in claim 1, wherein the upper end edge has the curved shape.

6. The flexible printed circuit board as claimed in claim 1, wherein the lower end edge has the curved shape.

7. The flexible printed circuit board as claimed in claim 1, wherein the curved shape is an arc shape and a radius of curvature of the arc shape is 0.2 μm or greater and 4 μm or less.

8. A method of manufacturing a flexible printed circuit board including a base film having an insulating property and one or more interconnects laminated to at least one surface side of the base film, wherein each of at least one of the one or more interconnects includes, in a longitudinal direction, a first portion and a second portion that is a portion other than the first portion, an average thickness of the second portion being greater than an average thickness of the first portion, a ratio of the average thickness of the second portion to the average thickness of the first portion is greater than or equal to 1.5 and less than or equal to 50, the first portion includes a first plating layer, and the second portion includes the first plating layer and a second plating layer, the second plating layer is laminated on the first plating layer at a boundary between the first portion and the second portion, wherein the second portion includes an edge at the boundary between the first portion and the second portion, and the edge of the second portion includes an upper end edge and a lower end edge of the second plating layer in the longitudinal direction, and at least one of the upper end edge or the lower end edge has a curved shape, the method comprising:
forming one or more first plating bodies extending in the longitudinal direction by electroplating a first metallic material on a conductive underlayer of the base film by using a first resist pattern, the conductive underlayer being laminated to at least one surface side of the base film;

removing the first resist pattern and non-laminated regions of the conductive underlayer where the one or more first plating bodies are not laminated after the forming of the one or more first plating bodies;

forming one or more second plating bodies by partially electroplating a second metallic material on each of the one or more first plating bodies in the longitudinal direction by using a second resist pattern after the removing of the first resist pattern and the non-laminated regions of the conductive underlayer; and removing the second resist pattern after the forming of the one or more second plating bodies;

so that the first portion is formed as a first laminated structure including the conductive underlayer and a corresponding one of the one or more first plating bodies, and the second portion is formed as a second laminated structure including the conductive underlayer, a corresponding one of the one or more first plating bodies, and a corresponding one of the one or more second plating bodies.

9. A method of manufacturing a flexible printed circuit board including a base film having an insulating property and one or more interconnects laminated to at least one surface side of the base film, wherein each of at least one of the one or more interconnects includes, in a longitudinal direction, a first portion and a second portion that is a portion other than the first portion, an average thickness of the second portion being greater than an average thickness of the first portion, and a ratio of the average thickness of the second portion to the average thickness of the first portion is greater than or equal to 1.5 and less than or equal to 50, the first portion includes a first plating layer, and the second portion includes the first plating layer and a second plating layer, the second plating layer is laminated on the first plating layer at a boundary between the first portion and the second portion, wherein the second portion includes an edge at the boundary between the first portion and the second portion, and the edge of the second portion includes an upper end edge and a lower end edge of the second plating layer in the longitudinal direction, and at least one of the upper end edge or the lower end edge has a curved shape, the method comprising:

forming one or more third plating bodies extending in the longitudinal direction by electroplating a third metallic material on a conductive underlayer of the base film by using a third resist pattern, the conductive underlayer being laminated to at least one surface side of the base film;

removing the third resist pattern after the forming of the one or more third plating bodies;

forming one or more fourth plating bodies extending in the longitudinal direction by electroplating a fourth metallic material so as to include at least a non-laminated region of the conductive underlayer where the one or more third plating bodies are not laminated and connect to the one or more third plating bodies in the longitudinal direction by using a fourth resist pattern after the removing of the third resist pattern, an average thickness of each of the one or more fourth, plating bodies being greater than an average thickness of each of the one or more third plating bodies; and removing the fourth resist pattern and non-laminated regions of the conductive underlayer where the one or more third plating bodies and the one or more fourth plating bodies are not laminated after the forming of the one or more fourth plating bodies;

so that the first portion is formed as a third laminated structure including the conductive underlayer and a corresponding one of the one or more third plating bodies, and the second portion is formed as a fourth laminated structure including the conductive underlayer and a corresponding one of the one or more fourth plating bodies.

* * * * *